(12) United States Patent
Noguchi

(10) Patent No.: US 9,053,759 B2
(45) Date of Patent: Jun. 9, 2015

(54) SEMICONDUCTOR DEVICE HAVING PLURAL SELECTION LINES

(71) Applicant: PS4 Luxco S.a.r.l., Luxembourg (LU)

(72) Inventor: Hidekazu Noguchi, Tokyo (JP)

(73) Assignee: PS4 Luxco S.a.r.l., Luxembourg (LU)

(*) Notice: Subject to any disclaimer, the term of this patent is extended or adjusted under 35 U.S.C. 154(b) by 31 days.

(21) Appl. No.: 13/683,538

(22) Filed: Nov. 21, 2012

(65) Prior Publication Data

US 2013/0135947 A1    May 30, 2013

(30) Foreign Application Priority Data

Nov. 25, 2011    (JP) .................................. 2011-257175

(51) Int. Cl.
| | |
|---|---|
| G11C 8/06 | (2006.01) |
| G11C 7/00 | (2006.01) |
| G11C 8/08 | (2006.01) |
| G11C 8/14 | (2006.01) |
| G11C 11/408 | (2006.01) |
| G11C 11/4097 | (2006.01) |

(52) U.S. Cl.
CPC .. *G11C 8/06* (2013.01); *G11C 7/00* (2013.01); *G11C 8/08* (2013.01); *G11C 8/14* (2013.01); *G11C 11/4085* (2013.01); *G11C 11/4087* (2013.01); *G11C 11/4097* (2013.01)

(58) Field of Classification Search
CPC .............. G11C 8/08; G11C 8/10; G11C 8/12; G11C 11/4085

USPC ............................ 365/189.11, 230.06, 230.03
See application file for complete search history.

(56) References Cited

U.S. PATENT DOCUMENTS

| | | | | |
|---|---|---|---|---|
| 6,490,222 B2 * | 12/2002 | Choi et al. | .................... | 365/201 |
| 6,781,915 B2 * | 8/2004 | Arimoto et al. | .......... | 365/230.03 |
| 6,985,399 B2 * | 1/2006 | Lee | .......................... | 365/230.06 |
| 7,626,862 B2 | 12/2009 | Matsubara | | |
| 7,733,735 B2 * | 6/2010 | Origasa | .................... | 365/230.06 |
| 2008/0123463 A1 | 5/2008 | Matsubara | | |
| 2011/0157965 A1 * | 6/2011 | Nii | ................................ | 365/156 |

FOREIGN PATENT DOCUMENTS

| | | |
|---|---|---|
| JP | 11-68063 | 3/1999 |
| JP | 11-111944 | 4/1999 |
| JP | 2008-135099 | 6/2008 |

* cited by examiner

*Primary Examiner* — Hoai V Ho
*Assistant Examiner* — Tri Hoang

(57) ABSTRACT

The semiconductor device includes a plurality of word lines classified into a plurality of groups and a selection circuit for selecting a word line according to an address. The selection circuit has a level shifter arranged for each of the groups. The address includes a first address for selecting any of the groups and a second address for selecting a word line in the selected group. The selection circuit selects a word line by allowing supply of active potential for word line by the level shifter of a group selected by the first address and further allowing supply of the active potential to the word line selected by the second address out of a plurality of word lines belonging to the selected group.

15 Claims, 14 Drawing Sheets

SEMICONDUCTOR DEVICE HAVING PLURAL SELECTION LINES

CROSS REFERENCE TO RELATED APPLICATIONS

This application claims priority to JP Patent Application No. 2011-257175, filed Nov. 25, 2011, the contents of which are incorporated herein by reference in their entirety.

BACKGROUND OF THE INVENTION

1. Field of the Invention

The present invention relates to a semiconductor device and particularly relates to a semiconductor device having a plurality of word lines selectively activated.

2. Description of Related Art

In recent years, many electronic apparatuses employ semiconductor device such as a DRAM (Dynamic Random Access Memory) as a memory device. A DRAM stores data by holding electric charges in memory cells arranged at intersection points of a plurality of word lines and a plurality of bit lines. Accordingly, access to a desired memory cell is made by selecting a word line and a bit line based on address information.

Word lines are connected to word drivers. Word drivers drive a selected word line based on address information supplied thereto. Note that techniques related to the memory cell and the word driver are described in Japanese Patent Application Laid-open No. H11-111944, Japanese Patent Application Laid-open No. H11-68063 and Japanese Patent Application Laid-open No. 2008-135099.

In accordance with higher integration of memory cells, the increasing number of word lines leads to place a larger load on word drivers that drive word lines. The increasing number of word lines leads to expand a circuit scale in the semiconductor device. In addition, the size in a direction to repeat word drivers is restricted by the size of memory cells and therefore the size that can be ensured for word drivers is reduced due to higher integration of memory cells. As a result, under a limited repeating pitch and limited wiring layers, it is difficult to pull out word lines from both sides of one word driver. Therefore, such a problem is often dealt with by juxtaposing two word drivers to simply pull out word lines only from one side of each driver. However, if a repeating pitch is further reduced with a larger reduction rate to process memory cells than drivers, the method of putting two word drivers side by side imposes restrictions on further reduction of a circuit scale in the semiconductor device.

Note that in a hierarchical word line structure, word lines are composed of MWL (Main Word Line) and SWL (Sub-Word Line). A plurality of SWLs is related to one of MWLs. Based on address information, MWL is selected and one SWL is selected out of a plurality of SWL related to the selected MWL. Even in a memory with such a hierarchical word line structure, a similar problem arises with MWL and main word drivers.

SUMMARY

In one embodiment, there is provided a semiconductor device that includes: a plurality of circuit sets each including a plurality of drive circuits; a plurality of selection circuits each assigned to an associated one of the circuit sets such that each of the selection circuits are coupled in common to the driver circuits included in the associated one of the circuit sets; and a plurality of selection lines. One of the selection circuits selected by a first signal supplies an active potential to a first output node thereof. Each of the drive circuits includes a first transistor coupled between an associated one of the selection lines and the first output node of the associated one of the selection circuits, the first transistor having a control electrode supplied with a second signal that id different from the first signal.

In another embodiment, there is provided a semiconductor device that includes: a plurality of word lines classified into a plurality of groups; and a selection circuit selecting one of the word lines according to an address signal. The selection circuit includes a plurality of level shifters each assigned to an associated one of the groups. The address signal includes a first signal that selects one of the groups and a second signal that selects one of the word lines in the selected group. One of the level shifters assigned to the selected group selected by the first signal supplies an active potential to one of the word lines selected by the second signal.

The present invention makes it easier to reduce the size of a semiconductor device by reducing in the size of word line selection circuits.

DETAILED DESCRIPTION OF THE EMBODIMENTS

In the embodiment of the present invention, a DRAM as one of the semiconductor devices is assumed, but the present invention is not limited to DRAM. Also, selection of a main word line will be mainly described in the present embodiment but the present invention is applicable to selection of a signal line other than a main word line.

Figure 1:
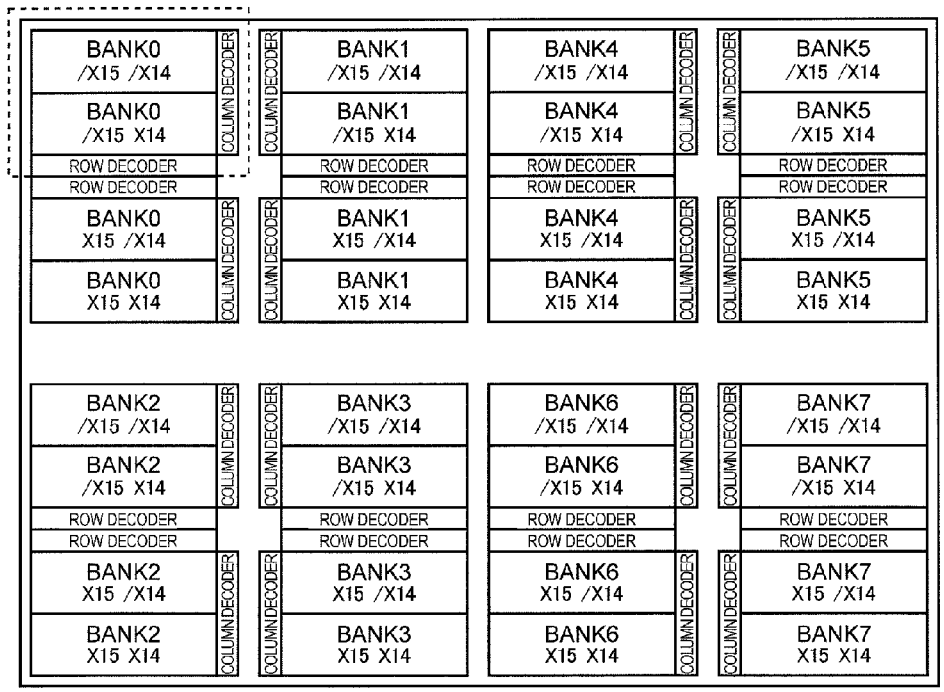
FIG. 1 is a schematic diagram showing a layout of memory banks in a semiconductor device according to an embodiment of the present invention.
Figure 2:
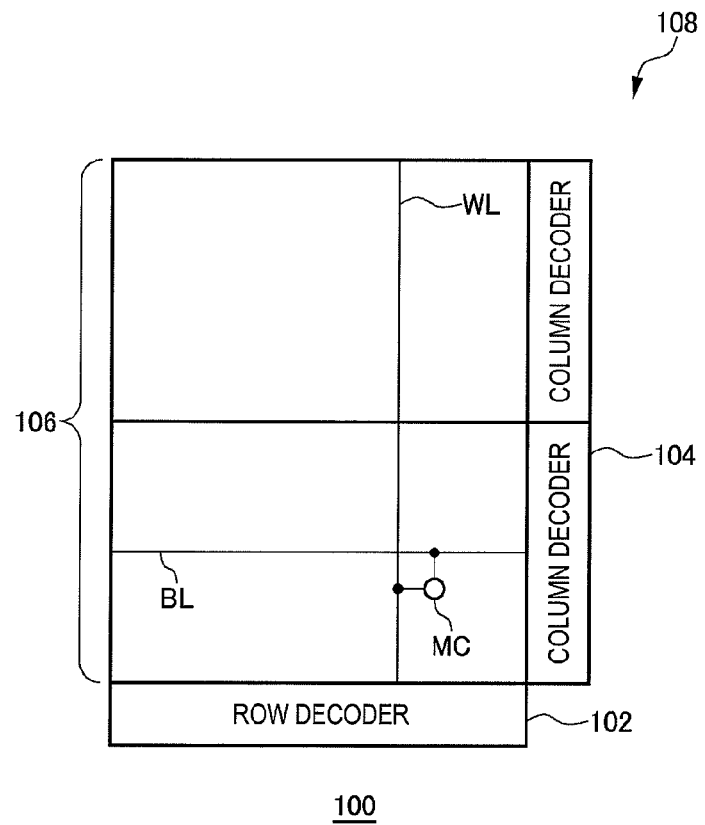
FIG. 2 is an enlarged view of an area surrounded by a broken line in FIG. 1.

Referring now to FIGS. 1 and 2, the memory cell array 108 has a plurality of memory banks 106. Each of the memory banks 106 serves as an independently accessible storage area and contains a plurality of memory mats (to be described later).

In the memory banks 106, a plurality of word lines WL (including main word lines and sub-word lines) and bit lines BL are arranged vertically and horizontally and memory cells MC are arranged at intersection points of these lines. Owing to an electric charge held by each of the memory cells MC, information of one bit is stored therein. In the periphery of the memory banks 106, peripheral circuits such as row decoders 102 and column decoders 104 are arranged. The row decoders 102 select any of the word lines WL and the column decoders 104 select any of the bit lines BL. The memory cell MC positioned at an intersection point of the word line WL and the bit line BL to be selected becomes target to be accessed.

Figure 3:
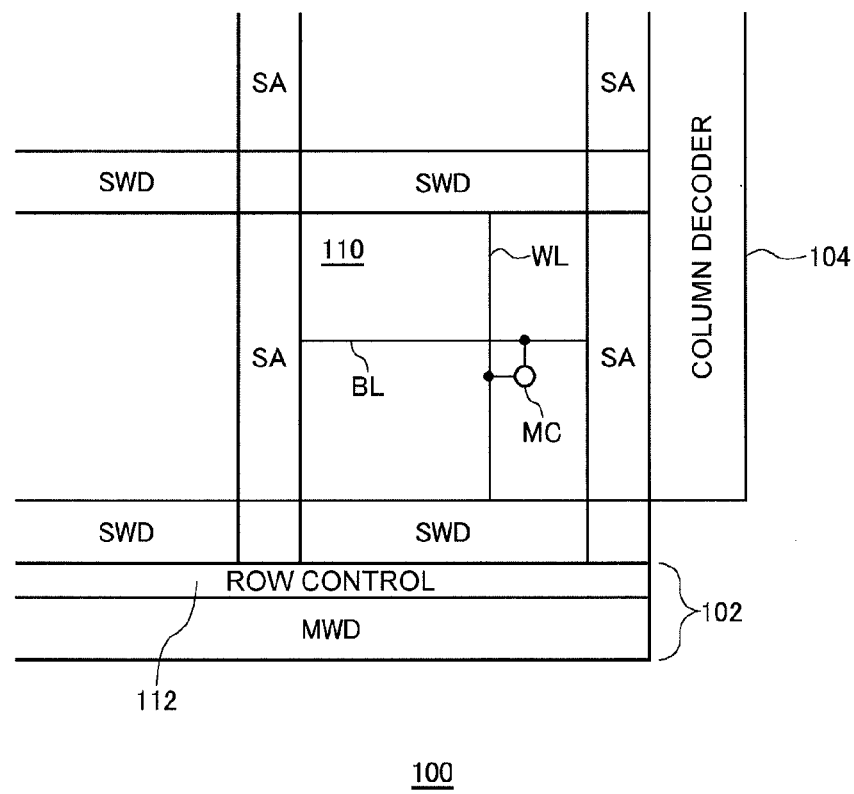
FIG. 3 is a schematic circuit diagram showing a memory mat and the periphery thereof.

Turning to FIG. 3, each of the memory banks 106 has a plurality of the memory mats 110. In each of the memory mats 110, the word lines WL (including main word lines and sub-word lines) and the bit lines BL are arranged. In the periphery of the memory mats 110, sense amplifier circuits SA and sub-word drivers SWD are arranged. Each of the row decoders 102 includes a row control circuit 112 and a main word driver MWD.

The main word driver MWD selects a main word line according to a part of address information. Address information is also supplied to the row control circuit 112. In accordance with address information decoded by the row control circuit 112, the sub-word drivers SWD select sub-word lines. A plurality of sub-word lines is related to one main word line and a plurality of main word lines is related to one memory mat 110. The memory bank 106, a main word line and a sub-word line are specified sequentially by a part of address information.

Address information is also supplied to the column decoders 104 and the column decoders 104 select any of the bit lines BL. Any of the bit lines BL to be selected is connected to a local I/O line via the sense amplifier circuit SA. Electric potential of any of the memory cell MC positioned at an intersection point of any of the word lines WL (or sub-word lines) and the bit lines BL that have been selected is amplified by the sense amplifier circuit SA via the bit line BL and outputted to the outside as data via a local I/O line. Also, data supplied as electric potential from the outside via the sense amplifier circuits SA is supplied to the memory cells MC in order to execute a write process. In the present embodiment, the main word drivers MWD function as "selection circuit" for main word line. Next, common structures of the main word drivers MWD will be explained in association with FIG. 4 to FIG. 6 and problems therein will be pointed out.

Figure 4:
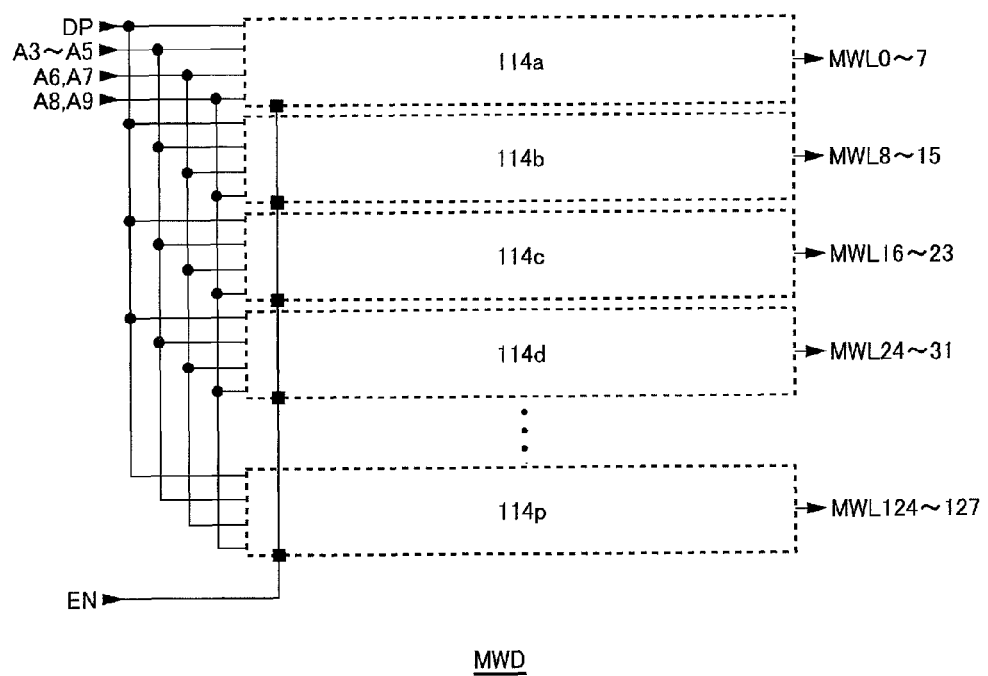
FIG. 4 is a circuit diagram of main word drivers that the inventor has conceived as a prototype in the course of making the present invention.

Turning to FIG. 4, in the prototype example, address information of fourteen bits (i.e. A0 to A13) are used to select any of the memory banks 106, the word lines WL (including main word lines and sub-word lines) and the bit lines BL. Explanation will be made on the assumption that any of the main word lines MWL is selected by a total of seven bits including A3 to A9 out of the address information. The addresses A3 to A9 relating to the selection of any of the main word lines MWL will be referred to as "main word address" hereinafter.

In the configuration of FIG. 4, one hundred twenty eight of the main word lines MWL are classified into sixteen groups (i.e. first groups) each of which contains eight lines such as main word lines MWL0 to 7, MWL8 to 15, . . . , and MWL124 to 127. First group selection circuits 114 are allocated to the respective first groups. The main word driver MWD includes sixteen of first group selection circuits 114a to 114p.

A reset signal DP is a low active signal. When the reset signal DP is activated to a low level, the entire main word lines MWL0 to MWL127 become non-selective. An enable signal EN is also a low active signal. When the enable signal EN is inactive (in a high level), selection of the main word lines MWL is impossible. Addresses A6 to A9 of four bits included in the main word address A3 to A9 are used to select any of the first group selection circuits 114. The addresses A6 to A9 relating to the group selection are referred to as "first address".

Figure 5:
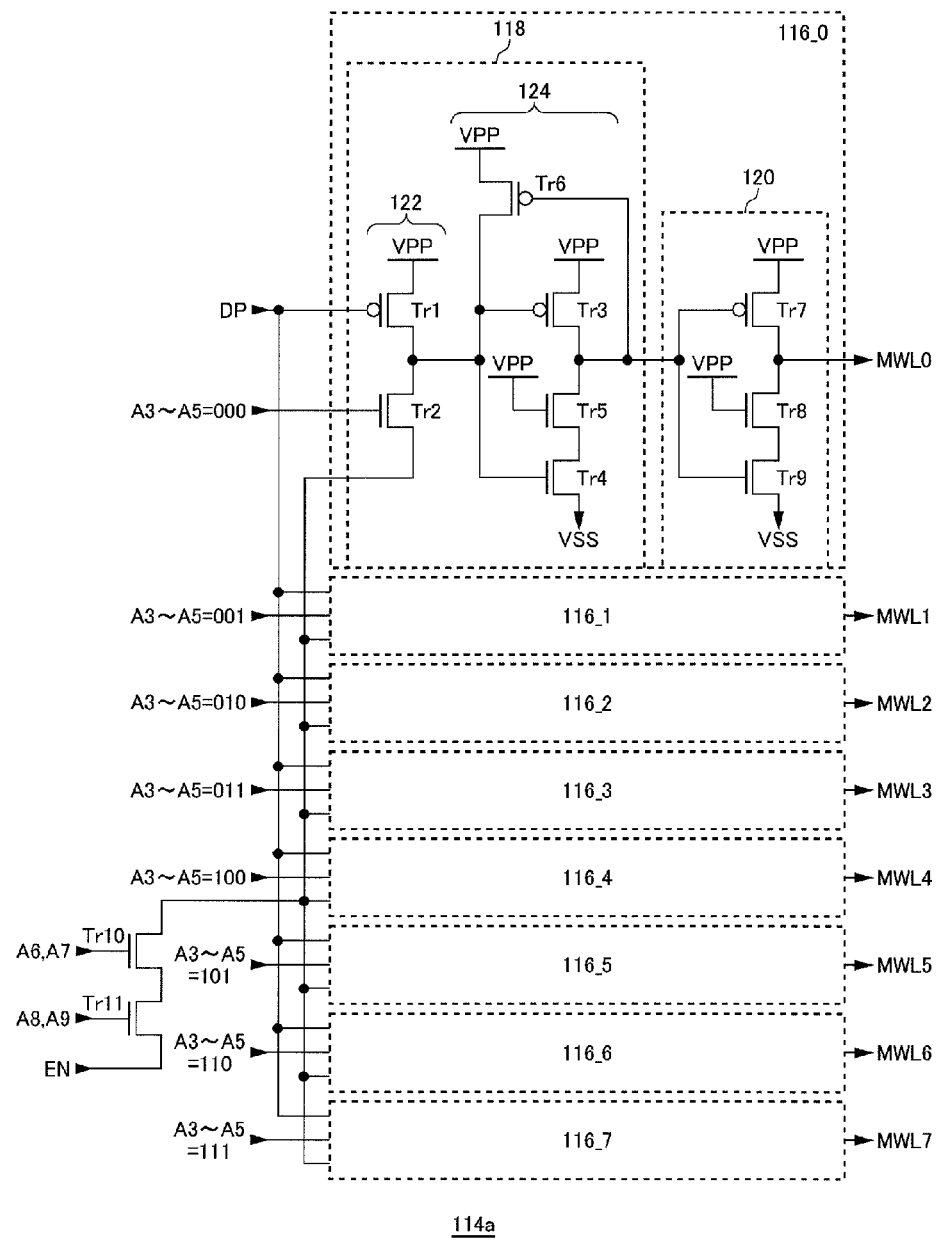
FIG. 5 is a circuit diagram of the first group selection circuit shown in FIG. 5.

Turning to FIG. 5, the first group selection circuit 114a includes eight of the main word lines MWL0 to MWL7 to which word activation circuits 116_0 to 116_7 are related, respectively. Addresses A3 to A5 of three bits included in the main word address A3 to A9 are used to select any of the word activation circuits 116. The addresses A3 to A5 relating to the selection of the main word lines MWL are referred to as "second address".

Each of the word activation circuits 116 includes a level shifter 118 and a third inverter 120. The level shifter 118 is controlled by the second address A3 to A5 and generates first potential VPP which is inactive potential and second potential VSS which is active potential for the main word lines MWL. The level shifter 118 includes a first inverter 122 and a second inverter 124.

It is assumed that the first group selection circuit 114a is selected by the first address A6 to A9 when the reset signal DP is turned off (in a high level) and the enable signal EN is turned on (in a low level). The first inverter 122 in each of the word activation circuits 116 is a circuit in which a transistor Tr1 of PMOS (Positive channel Metal Oxide Semiconductor) and a transistor Tr2 of NMOS (Negative channel Metal Oxide Semiconductor) are connected in series to each other and one end of the first inverter 122 (on the transistor Tr1 side) is fixed to the inactive potential VPP (or first potential). The enable signal EN is inputted to the other end of the first inverter 122 (on the transistor Tr2 side) via transistors Tr10 and Tr11 controlled by the first address A6 to A9. When the transistors Tr10 and Tr11 are turned on and the enable signal EN is active, the active potential VSS (or second potential) is supplied to the other end of the first inverter 122 (on the transistor Tr2 side). Thus, when the first group selection circuit 114a is selected, the inactive potential VPP and the active potential VSS are supplied to the first inverters 122 in the entire word activation circuits 116_0 to 116_7.

Here, it is assumed that the main word line MWL0 is selected. At this time, the second address (A3, A4, A5) is equal to (000). In the first inverter 122 of the word activation circuit 116_0, the transistor Tr2 is turned on and the active potential VSS is outputted. The second inverter 124 includes transistors Tr3 to Tr6 and outputs the inactive potential VPP by inverting the output of the first inverter 122. The third inverter 120 includes transistors Tr7 to Tr9 and outputs the active potential VSS by inverting the output of the second inverter 124. Thus, the active potential VSS (or second potential) is supplied to the main word line MWL0 and the main word line MWL0 is activated. In contrast, the inactive potential VPP is supplied to the entire remaining main word lines MWL.

In the structure as shown above, the level shifter 118 and the third inverter 120 are provided for each of the word activation circuits 116. In other words, one hundred twenty eight of the level shifters 118 need to be prepared for one hundred twenty eight of the main word lines MWL.

Figure 6:
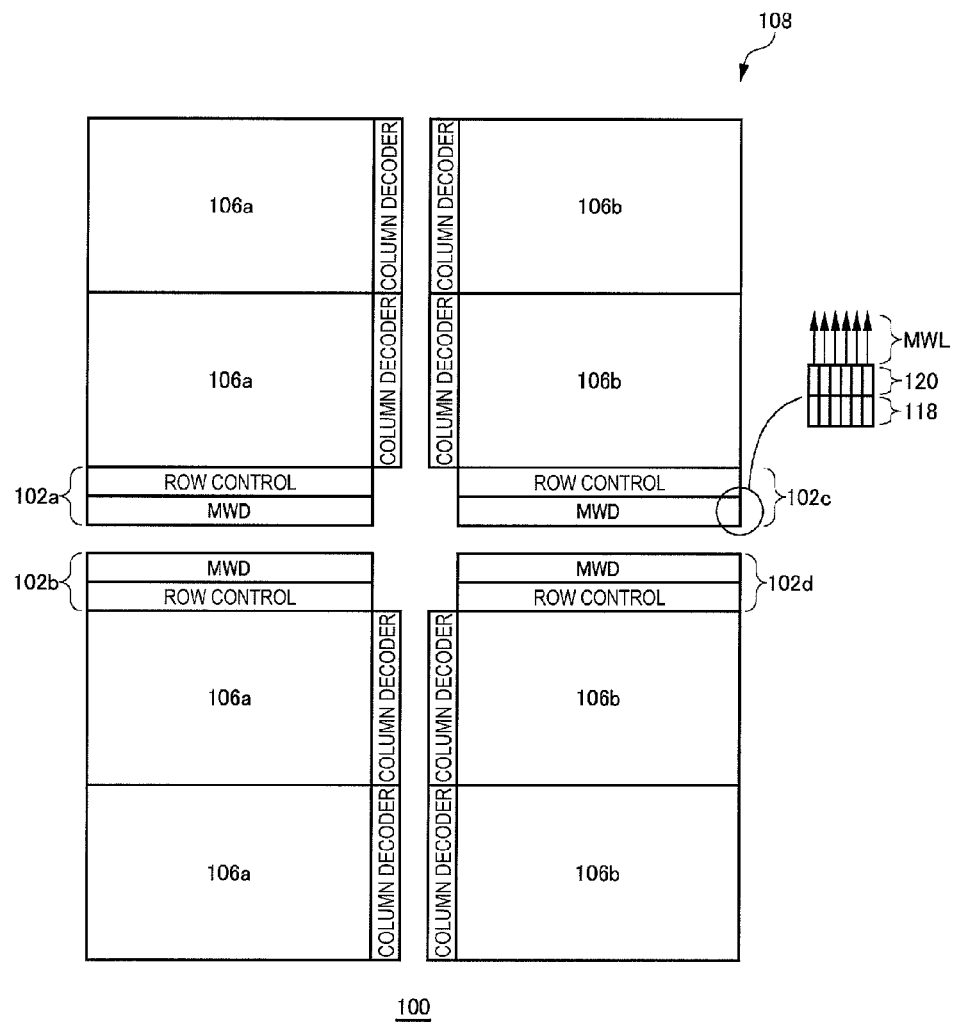
FIG. 6 is a layout diagram of the memory cell arrays and the main word drivers that the inventor has conceived as a prototype in the course of making the present invention.

Turning to FIG. 6, in the prototype example, the main word drivers MWD shown in FIG. 4 and FIG. 5 control the memory mats 110 only on one side. It is because the main word lines MWL can be pulled out only from one side of the main word drivers MWD due to a large circuit scale and a complicated wiring layout in the main word drivers MWD. The size in a direction to repeat the drivers is also restricted by the size of the memory cells and there is no room to spare on the layout, which means there is no room to pull out the main word lines toward the level shifter 118, whereby making it difficult for one main word driver MWD to collectively control the main word lines MWL on both sides thereof.

FIG. 6 shows memory banks 106a are arranged on both sides in areas in which a row decoder 102a and a row decoder 102b are arranged. In the common structure of the main word drivers MWD shown in FIG. 4 and FIG. 5, four of the main word drivers MWD need to be arranged for two of the memory banks 106a and 106b. In order to reduce an area occupied by the main word drivers MWD in the memory cell arrays 108, the main drivers MWD will be composed as shown in FIG. 7 to FIG. 9 in the present embodiment.

Figure 7:
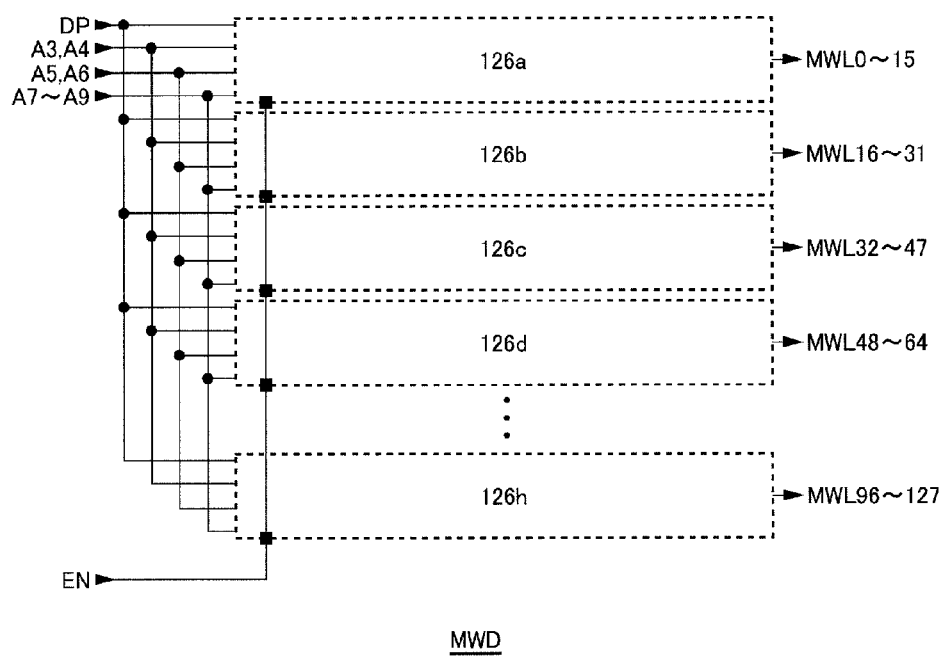
FIG. 7 is a circuit diagram of the main word drivers MWD according to the embodiment of the present invention.

Turning to FIG. 7, according to the present embodiment, one hundred twenty eight of the main word lines MWL are classified into eight groups (i.e. first groups) each of which contains sixteen lines such as main word lines MWL0 to 15, MWL16 to 31, ..., and MWL96 to 127. First group selection circuits 126 are allocated to the respective first groups. That is, the main word drivers MWD include eight of first group selection circuits 126a to 126h.

The reset signal DP is a low active signal. When the reset signal DP is activated, the entire main word lines MWL0 to MWL127 become non-selective. The enable signal EN is also a low active signal. When the enable signal EN is inactive, selection of the main word lines MWL is impossible. Addresses A7 to A9 of three bits included in the main word address A3 to A9 are used to select any of the first group selection circuits 126. In the present embodiment, addresses A5 to A9 of 5 bits correspond to the "first address".

Figure 8:
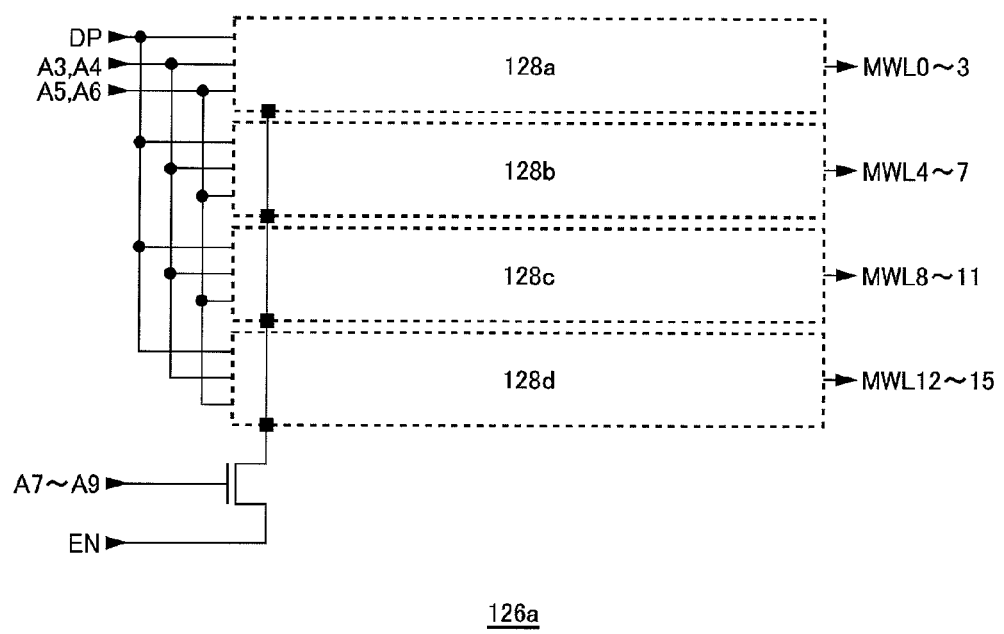
FIG. 8 is a circuit diagram of the first group selection circuit shown in FIG. 7.
Figure 9:
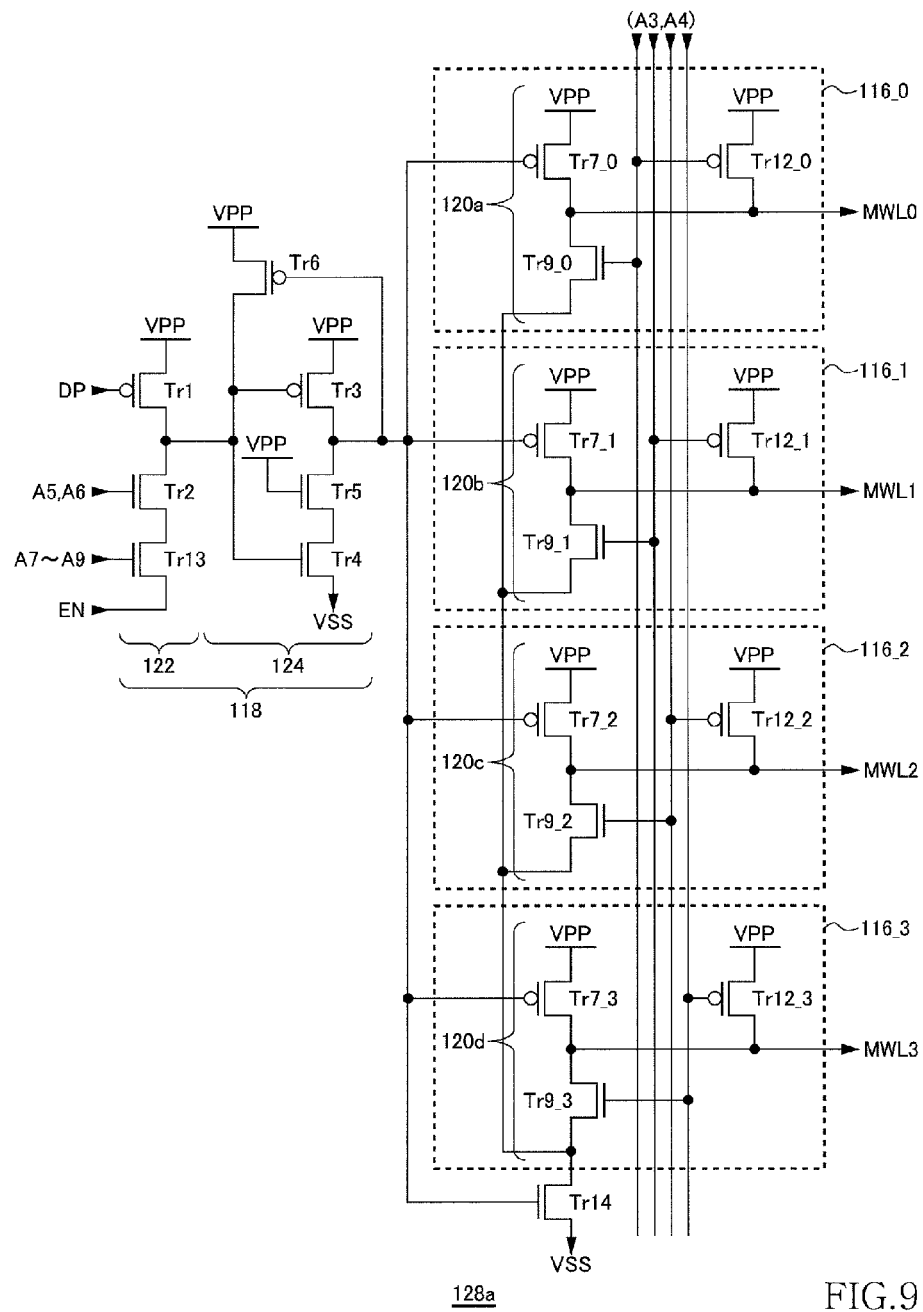
FIG. 9 is a circuit diagram of the second group selection circuit shown in FIG. 8.

As shown in FIG. 8, sixteen of the main word lines MWL0 to 15 related to the first group selection circuit 126a are further classified into four groups (i.e. second groups) each of which contains four lines. Second group selection circuits 128 are allocated to the respective second groups. That is, the first group selection circuit 126a includes four of second group selection circuits 128a to 128d. Addresses A5 and A6 of two bits included in the first address A5 to A9 are used to select any of the second group selection circuits 128.

As shown in FIG. 9, four of the main word lines MWL are related to the second group selection circuit 128a by which the level shifter 118 is shared. When the second group selection circuit 128a is selected, the first inverter 122 outputs potential of a low level and the second inverter 124 outputs potential of a high level. As a result, a transistor Tr14 is turned on. Second address of two bits including A3 and A4 is used to select any one line out of four of the main word lines MWL0 to MWL3.

It is assumed that the main word line MWL0 is selected. The first potential VPP and the second potential VSS are supplied to each one of four of third inverters 120a to 120d. A transistor Tr9_0 in the third inverter 120a corresponding to the main word line MWL0 is turned on by the address (A3, A4) that is equal to (0, 0) and the remaining transistors Tr9_1 to Tr9_3 are turned off. As a result, the third inverter 120a outputs the active potential VSS and the remaining third inverters 120b to 120d output high impedance.

Transistors Tr12_1 to Tr12_3 are connected to rear stages of the third inverters 120a to 120d, respectively. The transistors Tr12 function as "forcibly setting circuit" for supplying the inactive potential VPP. When the main word line MWL0 is selected, only the transistor TR12_0 is turned off and the remaining transistors Tr12_1 to Tr12_3 are turned on. The inactive potential VPP is supplied to the main word lines MWL1 to 3 that are non-selected via the transistors Tr12_1 to Tr12_3. The active potential VSS is supplied to the selected main word line MWL0 via the transistor Tr9_0 in the third inverter 120a. One of the main word lines MWL is thus selected.

When the main word line MWL1 is selected, the transistor Tr9_1 in the third inverter 120b is turned on and the remaining transistors Tr9_0, Tr9_2 and Tr9_3 are turned off. As a result, the active potential VSS is supplied to the main word line MWL1 and the inactive potential VPP is supplied to the remaining non-selected main word lines MWL via the transistors Tr12 (forcibly setting circuit).

Note that the transistor Tr14 and each of the transistors Tr9 are desirably controlled so that the transistor Tr14 is turned on first. By turning on the transistor Tr14 first, a potential difference between a source and a drain can be alleviated in the transistor Tr14 and the transistors Tr9, whereby making it easier to suppress hot carrier degradation. Conventional methods have also employed insertion of NMOS for suppression of hot carrier degradation in many cases. The present embodiment can use NMOS (or the transistor Tr14) without making any changes.

As stated above, the level shifter 118 is shared by a plurality of the word activation circuits 116 in the present embodiment. Therefore, a circuit scale in the second group selection circuits 128 can be reduced substantially and there is room to spare for a wiring layout. As a result, it is possible to pull out the main word lines MWL to both sides of the main word drivers MWD. Allowing more room for layout will result in easier use of a transistor with a high driving capacity in the third inverters 120. This will result in easier supply of sufficient active potential and inactive potential to the main word lines MWL, which also contributes to pulling out the main word lines MWL to both sides. Meanwhile, the size of the transistors Tr12 that do not contribute to a driving speed of the main word lines MWL is made smaller than the size of other transistors Tr included in the third inverters 120.

Figure 10:
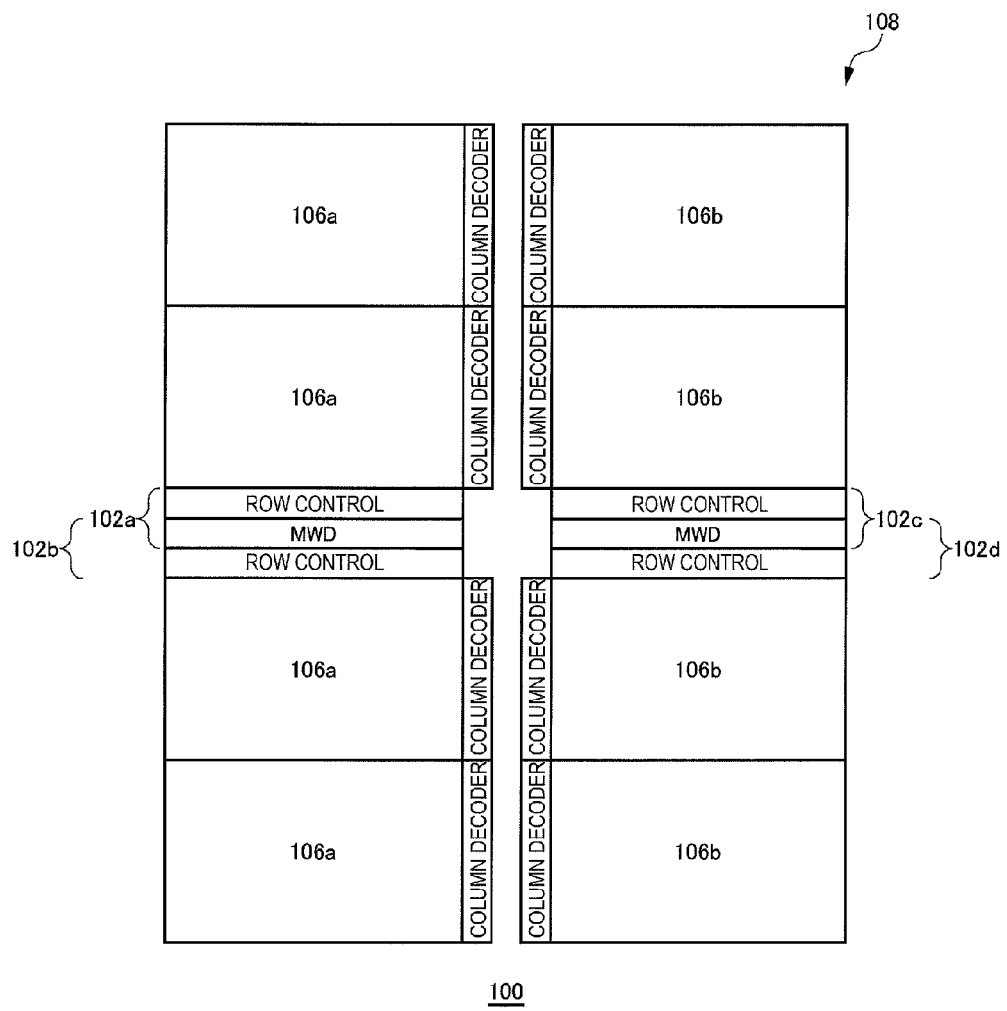
FIG. 10 is a layout diagram of the memory cell arrays 108 and the main drivers MWD according to the embodiment of the present invention.

Turning to FIG. 10, the main word drivers MWD control the memory banks 106 on both sides thereof in the present embodiment. As a result, two of the memory banks 106a and 106b can be controlled by two of the main word drivers MWD as shown in FIG. 10. This will result in reduction of an area occupied by the main word drivers MWD in the memory cell arrays 108.

Figure 11:
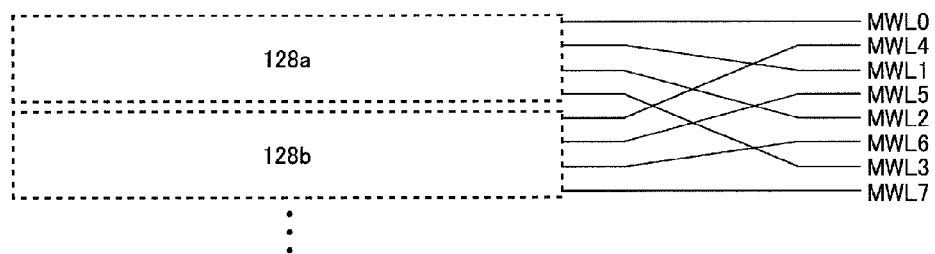
FIG. 11 is a layout diagram showing a relationship between the adjacent second group selection circuits and the main word lines.

As shown in FIG. 11, four of the main word lines MWL0 to MWL3 corresponding to the second group selection circuit 128a and four of the main word lines MWL4 to MWL7 corresponding to the second group selection circuit 128b are arranged alternately. This is for the purpose of suppressing disturbances of potential in the main word lines MWL caused by coupling.

Figure 12:
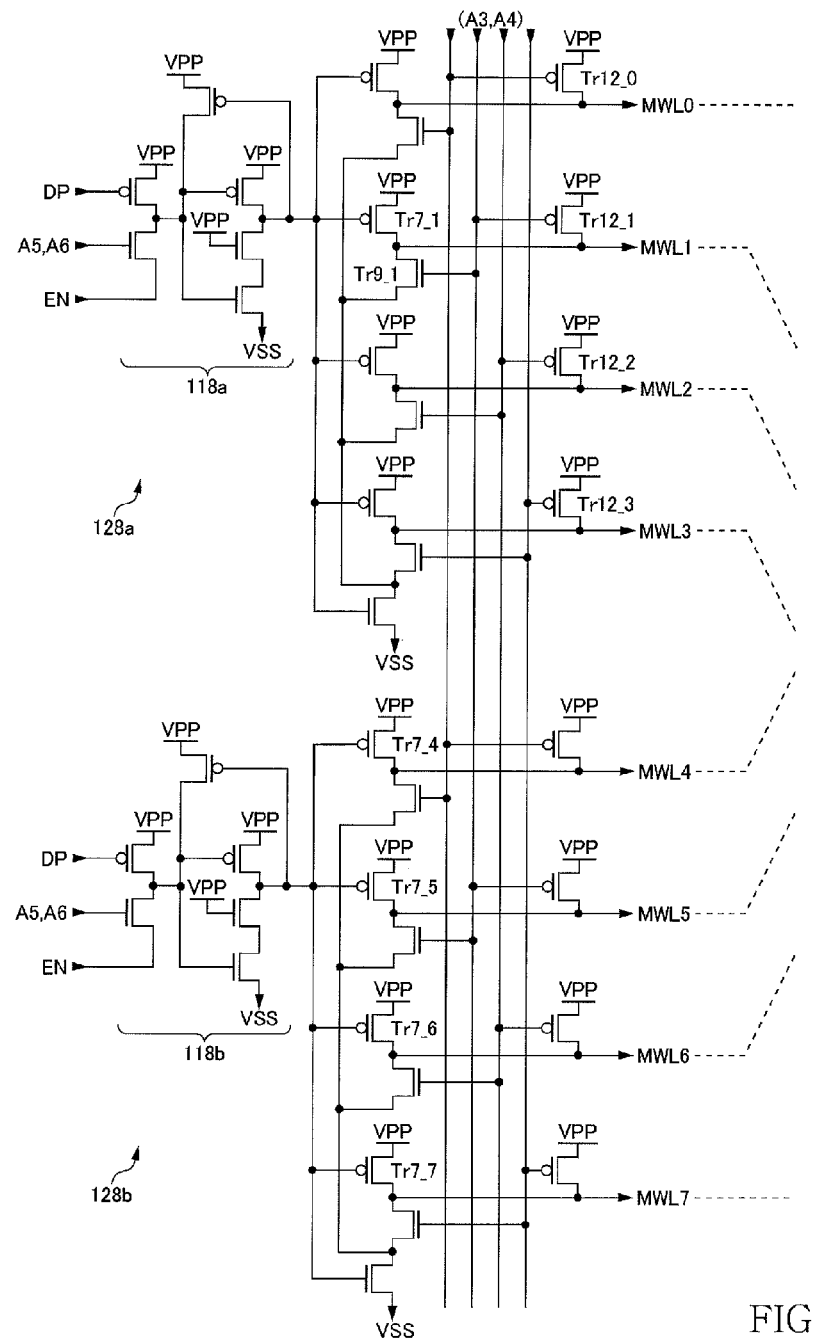
FIG. 12 is a wiring diagram showing more details of the relationship between the second group selection circuits and the main word lines.

Referring now to FIG. 12, it is assumed that the main word line MWL1 of the second group selection circuit 128a is selected. Firstly, a level shifter 118a in the second group selection circuit 128a is activated and the active potential VSS is supplied to the main word line MWL1. At this time, transistors Tr7_1 and Tr9_1 are both turned on. In contrast, the inactive potential VPP is supplied to the main word lines MWL0, MWL2 and MWL3 by turning on the transistors Tr12_0, Tr12_2 and Tr12_3 (i.e. forcibly setting circuit). At this time, due to coupling to the main word line MWL1, a voltage drop from the inactive potential VPP to the active potential VSS may possibly occur in potential of the non-selected main word lines MWL0, MWL2 and MWL3. It is because a force to fix the main word lines MWL0, MWL2 and MWL3 to the inactive potential VPP is weaker than a force to fix the main word line MWL1 to the active potential VSS due to the fact that the transistors Tr12 (i.e. forcibly setting circuit) have a less driving capacity than the transistors Tr7 and the transistors Tr9.

Meanwhile, since the second group selection circuit 128b is non-selected, a level shifter 118b in the second group selection circuit 128b is inactive. As a result, transistors Tr7_4 to Tr7_7 are turned on entirely to supply the inactive potential VPP to the main word lines MWL4 to MWL7. Since the transistors Tr7 have a larger capacity than the transistors Tr12 (i.e. forcibly setting circuit), a force to fix the main word lines MWL to the inactive potential VPP is strong. Therefore, by alternatively arranging the main word lines MWL in the adjacent second group selection circuits 128a and 128b, it is made easier to suppress a voltage drop caused by the aforementioned coupling.

Figure 13:
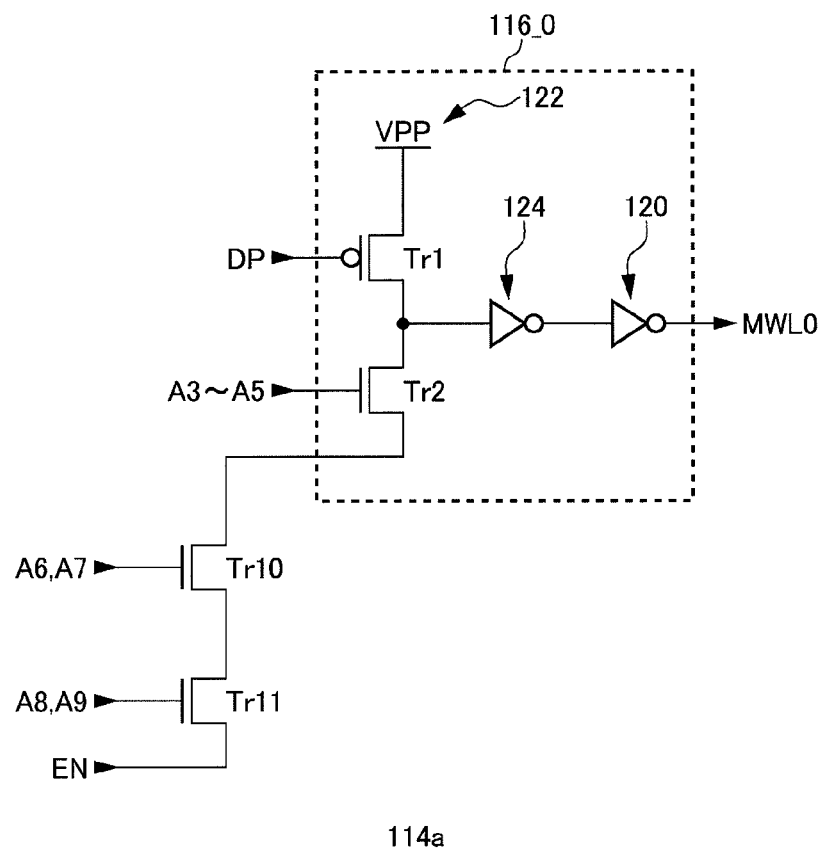
FIG. 13 is a conceptual diagram of the first group selection circuit of the prototype example shown in FIG. 5.
Figure 14:
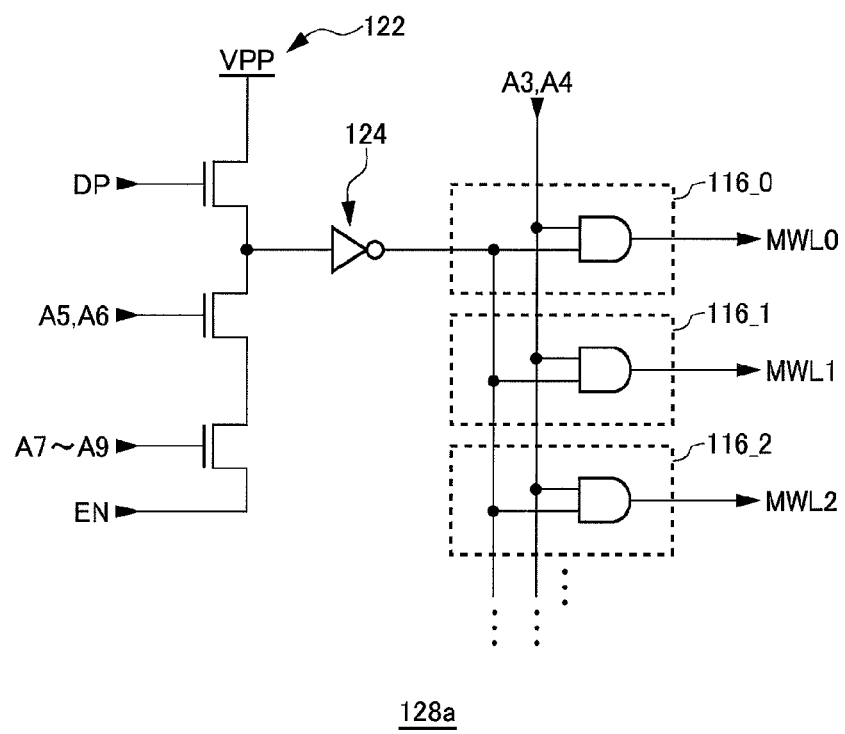
FIG. 14 is a conceptual diagram of the second group selection circuit shown in FIG. 9.

As shown in FIG. 13, three inverters including the first inverter 122 to the third inverter 120 are accommodated in one word activation circuit 116. As shown in FIG. 14, since two inverters that are the first inverter 122 and the second inverter 124 are shared, the word activation circuits 116 are allowed to have a simple structure which substantially includes only AND gate.

It is apparent that the present invention is not limited to the above embodiments, but may be modified and changed without departing from the scope and spirit of the invention.

What is claimed is:

1. A semiconductor device comprising:
a plurality of circuit sets each including a plurality of drive circuits;
a plurality of selection circuits each assigned to an associated one of the circuit sets such that each of the selection circuits are coupled in common to the driver circuits included in the associated one of the circuit sets; and
a plurality of selection lines, wherein
one of the selection circuits selected by a first signal supplies an active potential to a first output node thereof, wherein a control electrode of a common transistor is coupled to the first output node and the common transistor is coupled in common to the driver circuits in the associated one of the circuit sets, and
each of the drive circuits includes a first transistor coupled between an associated one of the selection lines and the first output node of the associated one of the selection circuits, the first transistor having a control electrode supplied with a second signal that is different from the first signal.

2. The semiconductor device as claimed in claim 1, wherein
the first signal includes a plurality of address bits each taking one of first and second potentials, and
the other of the selection circuits that are not selected by the first signal supplies an inactive potential to the first output node thereof.

3. The semiconductor device as claimed in claim 2, wherein
the one of the selection circuits selected by the first signal supplies a select output potential to a second output node thereof, and
each of the drive circuits further includes a second transistor coupled between a power line supplied with the inactive potential and the associated one of the selection lines, the second transistor having a control electrode coupled to the second output node of the associated one of the selection circuits.

4. The semiconductor device as claimed in claim 3, wherein each of the drive circuits further includes a third transistor coupled between the power line and the associated one of the selection lines, the third transistor having a control electrode supplied with the second signal.

5. The semiconductor device as claimed in claim 4, wherein the first transistor has a first conductivity type and the second and third transistors have a second conductivity type opposite to the first conductivity type.

6. The semiconductor device as claimed in claim 2, wherein one of the first and second potentials has substantially the same value as that of the active potential.

7. The semiconductor device as claimed in claim 1, wherein the selection lines are main word lines each related to a plurality of sub-word lines, each of the sub-word lines are connected to a plurality of memory cells.

8. A semiconductor device comprising:
a plurality of word lines classified into a plurality of groups; and
a selection circuit selecting one of the word lines according to an address signal, wherein
the selection circuit includes a plurality of level shifters each assigned to an associated one of the groups,
the address signal includes a first signal that selects one of the groups coupled in common to a first output node and a second signal that selects one of the word lines in the selected group, wherein a control electrode of a common transistor is coupled to the first output node and the common transistor is coupled in common to the selected group, and
one of the level shifters assigned to the selected group selected by the first signal supplies an active potential to one of the word lines selected by the second signal.

9. The semiconductor device as claimed in claim 8, wherein the selection circuit further includes a plurality of inverter circuits each assigned to an associated one of the word lines, each of the inverter circuits transferring the active potential to the associated one of the word lines when selected by the second signal.

10. The semiconductor device as claimed in claim 9, wherein each of the inverter circuits has a first power node fixed to an inactive potential, a second power node supplied with the active potential when corresponding one of the level shifters is selected by the first signal, and an output node connected to the associated one of the word lines.

11. The semiconductor device as claimed in claim 10, wherein each of the inverter circuits supplies the active potential to the output node thereof when selected by the second signal and supplies the inactive potential to the output node thereof when not selected by the second signal.

12. The semiconductor device as claimed in claim 11, wherein
the second signal comprises a plurality of address bits, and
each of the inverter circuits further has an input node supplied with one of the address bits.

13. The semiconductor device as claimed in claim 10, wherein the selection circuit further includes a plurality of inactivation circuits each assigned to an associated one of the word lines, ones of the inactivation circuits that are not selected by the second signal supplying the inactive potential to the associated ones of the word lines.

14. The semiconductor device as claimed in claim 8, wherein a plurality of word lines belonging to predetermined one of the groups and a plurality of word lines belonging to predetermined another one of the groups are disposed alternately.

15. A semiconductor device comprising:
a plurality of circuit sets each including a plurality of drive circuits;
a plurality of selection circuits each including a level shifter assigned to an associated one of the circuit sets such that each level shifter is coupled in common to the driver circuits included in the associated one of the circuit sets;
a plurality of main word selection lines, each related to a plurality of sub-word lines, wherein
one of the selection circuits selected by a first address signal supplies a high level output to a first output node of the level shifter in the selection circuit selected by the first address signal, wherein a control electrode of a common transistor is coupled to the first output node and the common transistor is coupled in common to the driver circuits in the associated one of the circuit sets, and
each of the drive circuits includes a first transistor for connecting an associated one of the main word selection lines to an active potential in response to the high level output at the first output node, the first transistor having a control electrode supplied with a second address signal that is different from the first address signal.

* * * * *